(12) United States Patent
Suzuki et al.

(10) Patent No.: US 7,910,281 B2
(45) Date of Patent: Mar. 22, 2011

(54) POSITIVE RESIST COMPOSITION FOR THIN-FILM IMPLANTATION PROCESS AND METHOD FOR FORMING RESIST PATTERN

(75) Inventors: Takako Suzuki, Kawasaki (JP); Ken Tanaka, Kawasaki (JP); Koji Yonemura, Kawasaki (JP); Shoichi Fujita, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 370 days.

(21) Appl. No.: 11/815,205

(22) PCT Filed: Feb. 1, 2006

(86) PCT No.: PCT/JP2006/301678
§ 371 (c)(1),
(2), (4) Date: Jul. 31, 2007

(87) PCT Pub. No.: WO2006/082855
PCT Pub. Date: Aug. 10, 2006

(65) Prior Publication Data
US 2009/0029291 A1    Jan. 29, 2009

(30) Foreign Application Priority Data
Feb. 2, 2005    (JP) .................................. 2005-026265

(51) Int. Cl.
*G03F 7/004*    (2006.01)
*G03F 7/30*    (2006.01)

(52) U.S. Cl. ..... 430/191; 430/192; 430/193; 430/270.1; 430/326; 430/905

(58) Field of Classification Search ............... 430/270.1, 430/326, 905, 191, 192, 193
See application file for complete search history.

(56) References Cited

U.S. PATENT DOCUMENTS

| | | | |
|---|---|---|---|
| 5,558,971 A | 9/1996 | Urano et al. | |
| 5,688,628 A | * 11/1997 | Oie et al. | .................. 430/176 |
| 6,627,381 B1 | 9/2003 | Uetani et al. | |
| 6,756,178 B2 | 6/2004 | Katano et al. | |
| 6,828,079 B2 | 12/2004 | Suetsugu et al. | |
| 2002/0090569 A1 | 7/2002 | Suzuki et al. | |
| 2002/0110750 A1 | 8/2002 | Sato et al. | |

FOREIGN PATENT DOCUMENTS

| | | |
|---|---|---|
| CN | 1407405 A | 4/2003 |
| JP | 08022965 | 1/1996 |
| JP | 10120629 | 5/1998 |
| JP | A-10-121029 | 5/1998 |
| JP | 2000031080 | 1/2000 |
| JP | 2000147773 | 5/2000 |
| JP | 2000275836 | 10/2000 |
| JP | 2000327714 | 11/2000 |
| JP | 2002341538 | 11/2002 |
| JP | 2004-054209 | 2/2004 |
| JP | 2004-317907 | 11/2004 |
| JP | 2006-189713 | 7/2006 |

OTHER PUBLICATIONS

Office Action issued on counterpart Japanese Patent Application No. 2005-026265, dated Mar. 10, 2009.
International Search Report from PCT/JP2006/301678 mailed on May 16, 2006.
Office Action issued in counterpart Chinese Patent Application No. 200680003206.3, dated May 20, 2010.

* cited by examiner

*Primary Examiner* — John S Chu
(74) *Attorney, Agent, or Firm* — Knobbe, Martens, Olson & Bear, LLP (57) ABSTRACT

A positive resist composition for a thin-film implantation process of the present invention includes: a resin component (A) with an acid-dissociable dissolution inhibiting group, whose alkali solubility increases by the action of an acid; an acid generator component (B) which generates an acid by irradiation with radiation; and a compound (C) having a radiation absorbing ability, wherein said resin component (A) comprises a structural unit (a1) derived from a hydroxystyrene and a structural unit (a2) obtained by substituting the hydrogen atom in a hydroxyl group of said structural unit (a1) with an acid-dissociable dissolution inhibiting group, and said acid-dissociable dissolution inhibiting group contains an acid-dissociable dissolution inhibiting group (II) represented by the following general formula (II) as a main component.

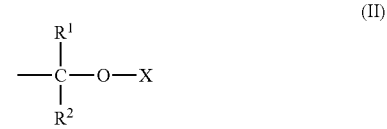

(II)

7 Claims, 1 Drawing Sheet

FIG. 1

POSITIVE RESIST COMPOSITION FOR THIN-FILM IMPLANTATION PROCESS AND METHOD FOR FORMING RESIST PATTERN

RELATED APPLICATIONS

This application is the U.S. National Phase filing under 35 U.S.C. §371 of PCT/JP2006/301678, filed Feb. 1, 2006, which designated the United States and was published in a language other than English, which claims priority under 35 U.S.C. §119(a)-(d) to Japanese Patent Application No. 2005-026265, filed Feb. 2, 2005. The content of these applications is incorporated herein by reference in their entireties.

TECHNICAL FIELD

The present invention relates to a positive resist composition for a thin-film implantation process, and a method for forming a resist pattern.

BACKGROUND ART

In photolithography techniques, steps are performed in which, for example, a resist film comprising a resist composition is formed on a substrate, then selective exposure is performed on the resist film through a photomask with a predetermined pattern by radiation such as light and electron beams, and developing is performed so as to form a resist pattern having a predetermined shape on the resist film. Resist compositions, in which the exposed portions are converted to be soluble in a developing solution, are referred to as the positive type, and resist compositions, in which the exposed portions are converted to be insoluble in a developing solution, are referred to as the negative type.

In recent years, in the production of semiconductor elements and liquid crystal display elements, advances in lithography techniques have led to rapid progress in the field of miniaturization. Typically, these miniaturization techniques involve shortening of the wavelength of the exposure light. Conventionally, ultraviolet radiation such as g-lines and i-lines have been used as the exposure light, but currently, KrF excimer lasers (248 nm) are being introduced, and ArF excimer lasers (193 nm) are now starting to be introduced. Moreover, $F_2$ excimer lasers (157 nm), EUV (extreme ultraviolet), electron beams, and X rays, whose wavelengths are shorter than those of the above lasers, are also being examined.

Moreover, reproduction of patterns with very fine dimensions requires resist materials with high resolution. As such resist materials, chemically amplified resist compositions comprising a base resin and an acid generator that generates acid by exposure, are used. For example, a chemically amplified positive resist comprises a resin component in which the alkali solubility increases by the action of an acid and an acid generator component that generates acid by exposure, and when an acid is generated from the acid generator by exposure in the formation of a resist pattern, the exposed portions are converted to an alkali soluble state.

Typically, resins such as polyhydroxystyrene (PHS) based resins in which the hydroxyl groups are protected by an acid-dissociable dissolution inhibiting group are used as resin components of chemically amplified positive resist compositions. Moreover, examples of used acid-dissociable dissolution inhibiting groups include: so-called acetal based acid-dissociable dissolution inhibiting groups such as chain-like ether groups typified by a 1-ethoxyethyl group, and cyclic ether groups typified by a tetrahydropyranyl group; and so-called annealing type acid-dissociable dissolution inhibiting groups such as tertiary alkyl groups typified by a tert-butyl group, and tertiary alkoxycarbonyl groups typified by a tert-butoxycarbonyl group (for example, see patent reference 1).

On the other hand, in the production of semiconductor elements and liquid crystal display elements, an impurity diffusion layer is formed on the surface of a substrate. The formation of the impurity diffusion layer is typically performed in two steps of introduction and diffusion of impurities. One of the introduction method is the ion implantation (hereafter referred to as implantation) in which an impurity such as phosphorus and boron is ionized in a vacuum and is accelerated in a high electric field to be injected into the surface of a substrate.

As the method of selectively injecting impurity ions into the surface of a substrate by implantation, for example, the "inclined implantation" process is reported in patent reference 2, in which an inclined substrate with a resist pattern (mask) is subjected to ion implantation. This process is believed to be effective for selective ion injection into small portions of the substrate directly below the resist pattern or into the side walls of holes formed in the substrate.

When a fine resist pattern of about 0.35 μm is formed by the inclined implantation process, a resist pattern serving as a mask must be very thin of about 0.1 to 0.5 μm so as not to inhibit ion implantation.

Furthermore, resist patterns in the inclined implantation process are required to have shape characteristics for injecting ions into desired position in the substrate.

However, in the inclined implantation process using such a thin film resist pattern (hereafter referred to as the thin-film implantation process), particularly, if a highly transparent resin for exposure light is used, the shape of the resist pattern is prone to be defective due to the effect of incident light during the exposure and reflected light from the substrate. In particular, in the production of semiconductor elements and liquid crystal display elements, since the thin-film implantation process is performed on substrates formed with electrodes and the like, it is difficult to form a resist film in an even thickness on these substrates. This results in a problem of a so-called standing wave (hereafter abbreviated as SW), that is a phenomenon in which the dimension of a resist pattern is increased/decreased due to variation in the resist film thickness. The dimensional change of pattern caused by the SW is prone to be increased as the resist film becomes thinner, and as the resist film becomes more transparent. In particular, this problem appears remarkable if the film is as thin as 500 nm or less. Moreover, the problem of the dimensional change becomes more serious as the resist pattern becomes finer.

In response to such a problem, an attempt is being made to suppress the dimensional change by blending a compound (dye) having absorbance of exposure light into a resist (for example, see patent reference 3).

[Patent Reference 1]
Japanese Unexamined Patent Application, First Publication No. 2002-341538
[Patent Reference 2]
Japanese Unexamined Patent Application, First Publication No. Hei 8-22965
[Patent Reference 3]
Japanese Unexamined Patent Application, First Publication No. 2003-149816

DISCLOSURE OF INVENTION

However, there is a limit in the amount of dimensional change that can be reduced by blending a dye, and it is still difficult to reduce the dimensional change in the thin-film implantation process using a thin film, in particular, a thin film of 500 nm or less.

The present invention takes the above problems into consideration, with an object of providing a positive resist composition for a thin-film implantation process capable of forming a resist pattern with small dimensional change on a thin film and suitable for use in thin-film implantation processes, and a method for forming a resist pattern.

As a result of intensive investigations, the inventors of the present invention discovered that the problem described above could be resolved by combining a resin having two types of specific structural units and a specific acid-dissociable dissolution inhibiting group, and a dye, that is, a compound having absorbing ability of exposure light (radiation), and they have hence completed the present invention.

That is, a first aspect of the present invention is a positive resist composition for a thin-film implantation process including:

a resin component (A) with an acid-dissociable dissolution inhibiting group, whose alkali solubility increases by the action of an acid;

an acid generator component (B) which generates an acid by irradiation with radiation; and a compound (C) having a radiation absorbing ability, wherein said resin component (A) includes a structural unit (a1) derived from a hydroxystyrene and a structural unit (a2) obtained by substituting the hydrogen atom in a hydroxyl group of said structural unit (a1) with an acid-dissociable dissolution inhibiting group, and said acid-dissociable dissolution inhibiting group contains an acid-dissociable dissolution inhibiting group (II) represented by the following general formula (II) as a main component:

(II)

[In the formula, X represents an alicyclic group, an aromatic cyclic hydrocarbon group, or an alkyl group having 1 to 5 carbon atoms, $R^1$ represents an alkyl group having 1 to 5 carbon atoms, or alternatively, X and $R^1$ each represents, independently, an alkylene group having 1 to 5 carbon atoms, in which an end of X and an end of $R^1$ may be bonded with each other; and $R^2$ represents an alkyl group having 1 to 5 carbon atoms or a hydrogen atom].

A second aspect of the present invention is a method for forming a resist pattern including: forming a resist thin film having a thickness of 500 mm or less using a positive resist composition for a thin-film implantation process according to the first aspect, on a substrate;

selectively exposing the resist thin film; and then developing the resist thin film to form a resist pattern.

In the present specification and claims, the term "structural unit" refers to a monomer unit that constitutes a resin component (polymer compound).

The term "alkyl group", unless stated otherwise, includes straight-chain, branched, and cyclic monovalent saturated hydrocarbon groups.

The term "exposure" refers to a general concept including irradiation with any form of radiation.

According to the present invention, a positive resist composition for a thin-film implantation process capable of forming a resist pattern with small dimensional change on a thin film and suitable for use in a thin-film implantation process, and a method for forming a resist pattern, can be provided.

BEST MODE FOR CARRYING OUT THE INVENTION

<<Positive Resist Composition>>

The positive resist composition for a thin-film implantation process according to the present invention (hereafter also referred to as the positive resist composition) includes: a resin component (A) with an acid-dissociable dissolution inhibiting group, whose alkali solubility increases by the action of an acid (hereafter also referred to as component (A)); an acid generator component (B) which generates an acid by exposure (hereafter also referred to as component (B)); and a compound (C) having a radiation absorbing ability (hereafter also referred to as component (C)).

In such a positive resist composition, when an acid is generated from the component (B) by exposure, the acid dissociates the acid-dissociable dissolution inhibiting group in the component (A), thus increasing the alkali solubility. As a result, in the formation of a resist pattern, when the resist composition applied on the substrate is subjected to selective exposure, the alkali solubility in the exposed portions is increased enabling alkali development.

<Component (A)>

In order to achieve the effects of the present invention, the component (A) has to comprise a structural unit (a1) derived from a hydroxystyrene and a structural unit (a2) obtained by substituting the hydrogen atom in the hydroxyl group of the structural unit (a1) with an acid-dissociable dissolution inhibiting group, and the acid-dissociable dissolution inhibiting group has to mainly contain an acid-dissociable dissolution inhibiting group (II) represented by the above formula (II). Using such a component (A) and a later described component (C) in combination provides the effects of the present invention.

Structural Unit (a1)

The "structural unit (a1)" is a structural unit derived from a hydroxystyrene.

The term "hydroxystyrene" refers to a general concept including: a hydroxystyrene itself; structures in which the hydrogen atom at the α-position in a hydroxystyrene has been substituted by another substituent group or atom such as a halogen atom, an alkyl group, or a halogenated alkyl group; and derivatives thereof. The term "structural unit derived from a hydroxystyrene" refers to a structural unit formed by cleavage of the ethylene based double bond of a hydroxystyrene. The "α-position (α-position carbon atom) in a structural unit derived from a hydroxystyrene", unless stated otherwise, refers to the carbon atom bonded to the benzene ring.

Examples of the structural unit (a1) include structural units represented by the following general formula (a1-1).

(a1-1)

[In the above formula, R represents a hydrogen atom, a lower alkyl group having 1 to 5 carbon atoms, a fluorine atom, or a fluorinated lower alkyl group; $R^6$ represents a lower alkyl group having 1 to 5 carbon atoms; p represents an integer of 1 to 3; and q represents an integer of 0 to 2.]

In the general formula (a1-1), R represents a hydrogen atom, a lower alkyl group, a fluorine atom, or a fluorinated lower alkyl group.

The lower alkyl group of R is an alkyl group having 1 to 5 carbon atoms, and preferably a straight-chain or branched alkyl group. Examples thereof include a methyl group, an ethyl group, a propyl group, an isopropyl group, an n-butyl group, an isobutyl group, a tert-butyl group, a pentyl group, an isopentyl group, and a neopentyl group. From an industrial point of view, a methyl group is preferred.

The fluorinated lower alkyl group means the above lower alkyl groups having 1 to 5 carbon atoms in which a part of or all of the hydrogen atoms are substituted by fluorine atoms. In the present invention, groups in which all of the hydrogen atoms are fluorinated are preferred. Preferred examples of the fluorinated lower alkyl group include straight-chain and branched fluorinated lower alkyl groups, more preferably a trifluoromethyl group, a hexafluoroethyl group, a heptafluoropropyl group, and a nonafluorobutyl group, and most preferably a trifluoromethyl group (—$CF_3$).

R is preferably a hydrogen atom or a methyl group, and more preferably a hydrogen atom.

The lower alkyl groups having 1 to 5 carbon atoms of $R^6$ are the same as those described for the lower alkyl groups of R.

q represents an integer of 0 to 2. Of these, q preferably represents 0 or 1, and particularly preferably 0 from an industrial point of view.

If q is 1, the substituent position of $R^6$ may be any one of the opposition, the m-position, or the p-position, and if q is 2, any combination of substituent positions is suitable.

p represents an integer of 1 to 3, and preferably 1.

If p is 1, the substituent position of the hydroxyl group may be any one of the opposition, the m-position, or the p-position, but the p-position is preferred in terms of availability and low cost. Furthermore, if p is 2 or 3, any combination of substituent positions is suitable.

The structural unit (a1) may be used singularly, or in mixtures of two or more different types.

In the component (A), the proportion of the structural unit (a1) is preferably 50 to 95 mol % per total structural units constituting the component (A), and more preferably 60 to 80 mol %. The above range provides an appropriate alkali solubility and a satisfactory balance between the structural unit (a1) and other structural units.

Structural Unit (a2)

The structural unit (a2) is obtained by substituting the hydrogen atom in a hydroxyl group of the structural unit (a1) with an acid-dissociable dissolution inhibiting group.

In the present invention, the acid-dissociable dissolution inhibiting group has to mainly contain an acid-dissociable dissolution inhibiting group (II) represented by the above formula (II).

Here, the term "mainly contain" means that the proportion of the acid-dissociable dissolution inhibiting group (I) in the total acid-dissociable dissolution inhibiting groups contained in the component (A) is more than 50 mol %, preferably 70 mol %, even more preferably 80 mol %, and most preferably 100 mol %.

In the formula (II), X represents an alicyclic group, an aromatic cyclic hydrocarbon group, or a lower alkyl group.

Here, the term "aliphatic" in the present specification and claims is a relative concept used to achieve a differentiation from the term "aromatic", and thus defines groups or compounds that contain no aromatic property. An "alicyclic group" refers to a monocyclic group or a polycyclic group that contains no aromatic property, and may be either saturated or unsaturated, although saturated groups are normally preferred.

The alicyclic group in X is a monovalent alicyclic group. The alicyclic group can be appropriately selected from the multitude of groups proposed for use in conventional KrF resists and ArF resists. Specific examples of the alicyclic group include aliphatic monocyclic groups having 5 to 7 carbon atoms, and aliphatic polycyclic groups having 10 to 16 carbon atoms. Examples of the aliphatic monocyclic groups having 5 to 7 carbon atoms include groups in which one hydrogen atom has been removed from a monocycloalkane. Specific examples thereof include groups in which one hydrogen atom has been removed from a cyclopentane, a cyclohexane, or the like. Examples of the aliphatic polycyclic groups having 10 to 16 carbon atoms include groups in which one hydrogen atom has been removed from a bicycloalkane, a tricycloalkane or a tetracycloalkane. Specific examples thereof include groups in which one hydrogen atom has been removed from a polycycloalkane such as an adamantane, a norbornane, an isobornane, a tricyclodecane or a tetracyclododecane. Of these groups, an adamantyl group, a norbornyl groups, and a tetracyclododecanyl group are preferred from an industrial point of view, and an adamantyl group is particularly preferred.

Examples of the aromatic cyclic hydrocarbon group in X include aromatic polycyclic groups having 10 to 16 carbon atoms. Specific examples thereof include groups in which one hydrogen atom has been removed from naphthalene, anthracene, phenanthrene, pyrene, or the like. Specifically, examples thereof include a 1-naphthyl group, a 2-naphthyl group, a 1-anthracenyl group, a 2-anthracenyl group, a 1-phenanthryl group, a 2-phenanthryl group, a 3-phenanthryl group, and a 1-pyrenyl group. Of these groups, a 2-naphthyl group is particularly preferred from an industrial point of view.

The lower alkyl groups of X are the same as those described for the lower alkyl groups of R in the above formula (a1-1).

In the structural unit (a2), X preferably represents a lower alkyl group, more preferably a methyl group or an ethyl group, and most preferably an ethyl group.

In the formula (II), the lower alkyl groups of $R^1$ are the same as those described for the lower alkyl groups of R in the above formula (a1-1). From an industrial point of view, a methyl group and an ethyl group are preferred, and a methyl group is particularly preferred.

$R^2$ represents a lower alkyl group or a hydrogen atom. The lower alkyl groups of $R^2$ are the same as those described for the lower aryl groups of $R^1$. Preferably, $R^2$ is a hydrogen atom from an industrial point of view.

Moreover, in the formula (II), the structure may be such that X and $R^1$ each represents, independently, an alkylene group having 1 to 5 carbon atoms, and an end of X and an end of $R^1$ are bonded with each other.

In this case, in the formula (II), a cyclic group is formed by $R^1$, X, an oxygen atom bonded with X, and a carbon atom bonded with the oxygen atom and $R^1$. The cyclic group is preferably a 4- to 7-membered ring, and more preferably a 4- to 6-membered ring. Specific examples of the cyclic group include a tetrahydropyranyl group and a tetrahydrofuranyl group.

The acid-dissociable dissolution inhibiting group (II) is particularly preferably a group in which $R^2$ is a hydrogen atom, which provides the excellent effects of the present invention. Specific examples thereof include: groups in which X is an alkyl group, namely: 1-alkoxyalkyl groups such as a 1-methoxyethyl group, a 1-ethoxyethyl group, a 1-iso-propoxyethyl group, a 1-n-butoxyethyl group, a 1-tert-butoxyethyl group, a methoxymethyl group, an ethoxymethyl group, an iso-propoxymethyl group, an n-butoxymethyl group, and a tert-butoxymethyl group; groups in which X is an alicyclic group, such as a 1-cyclohexyloxyethyl group, a 1-(2-adamanthyl)oxymethyl group, and a 1-(1-adamanthyl)oxyethyl group represented by the following formula (II-a); and groups in which X is an aromatic cyclic hydrocarbon group, such as a 1-(2-naphthyl)oxyethyl group represented by the following formula (II-b).

Of these, the 1-ethoxyethyl group is preferred.

(II-a)

(II-b)

In the present invention, the acid-dissociable dissolution inhibiting group may contain another acid-dissociable dissolution inhibiting group other than the acid-dissociable dissolution inhibiting group (II), without detracting from the effects of the present invention. Such an acid-dissociable dissolution inhibiting group can be appropriately selected and used from the multitude of resins proposed for resist compositions for use with a KrF excimer laser, an ArF excimer laser, or the like.

Examples of the acid-dissociable dissolution inhibiting group include at least one of an acid-dissociable dissolution inhibiting group (III) selected from the group consisting of a chain-like tertiary alkoxycarbonyl group, a chain-like or cyclic tertiary alkyl group, and a chain-like tertiary alkoxycarbonylalkyl group. The thermal resistance is improved by including the acid-dissociable dissolution inhibiting group (III).

The number of carbon atoms in the chain-like tertiary alkoxycarbonyl group is preferably within a range from 4 to 10, and more preferably from 4 to 8. Specific examples of the chain-like tertiary alkoxycarbonyl group include a tert-butoxycarbonyl group and a tert-amyloxycarbonyl group.

The number of carbon atoms in the chain-like tertiary alkyl group is preferably within a range from 4 to 10, and more preferably from 4 to 8. More specific examples of the chain-like tertiary alkyl group include a tert-butyl group and a tert-amyl group.

The cyclic tertiary alkyl group is a monocyclic or polycyclic monovalent saturated hydrocarbon group containing a tertiary carbon atom in the ring. Specific examples of the cyclic tertiary alkyl group include a 1-methylcyclopentyl group, a 1-ethylcyclopentyl group, a 1-methylcyclohexyl group, a 1-ethylcyclohexyl group, a 2-methyl-2-adamanthyl group, and a 2-ethyl-2-adamanthyl group.

The number of carbon atoms in the chain-like tertiary alkoxycarbonylalkyl group is preferably within a range from 4 to 10, and more preferably from 4 to 8. Specific examples of the chain-like tertiary alkoxycarbonylalkyl group include a tert-butoxycarbonylmethyl group and a tert-amyloxycarbonylmethyl group.

The acid-dissociable dissolution inhibiting group (III) is particularly preferably a chain-like tertiary alkyl group in terms of resolution. Of these, a tert-butyl group is preferred.

The structural unit (a2) may be used singularly, or in mixtures of two or more different types.

In the component (A), the proportion of the structural unit (a2) is preferably 5 to 40 mol % per total structural units constituting the component (A), and more preferably 10 to 35 mol %. A resist composition in which the proportion of the structural unit (a2) is not less than the lower limit provides a pattern, and one in which the proportion of the structural unit (a2) is not more than the upper limit provides a satisfactory balance between the structural unit (a2) and other structural units.

Structural Unit (a3)

The component (A) may further contain a structural unit (a3) derived from a styrene.

In the present invention, the structural unit (a3) does not have to be necessarily contained, but is capable of improving the thermal resistance if contained.

Here, the term "styrene" refers to a general concept including: a styrene itself, structures in which the hydrogen atom at the α-position in a styrene has been substituted by another substituent group or atom such as a halogen atom, an alkyl group, or a halogenated alkyl group; and derivatives thereof (but not including a hydroxystyrene). The term "structural unit derived from a styrene" refers to a structural unit formed by cleavage of the ethylene based double bond of a styrene. In the styrene, the hydrogen atom of the phenyl group may be substituted by a substituent group such as a lower alkyl group.

Examples of the structural unit (a3) include structural units represented by the following general formula (a3-1).

(a3-1)

[In the formula, R represents a hydrogen atom, a lower alkyl group having 1 to 5 carbon atoms, a fluorine atom, or a fluorinated lower alkyl group; $R^7$ represents a lower alkyl group having 1 to 5 carbon atoms; and r represents an integer of 0 to 3.]

In the formula (a3-1), R and $R^7$ are the same as R and $R^6$ in the above formula (a1-1).

r represents an integer of 0 to 3. Of these, r preferably represents 0 or 1, and particularly preferably 0 from an industrial point of view.

If r is 1 to 3, the substituent position of $R^7$ may be any one of the o-position, the m-position, or the p-position, and if r is 2 or 3, any combination of substituent positions is suitable.

The structural unit (a3) may be used singularly, or in mixtures of two or more different types.

If the component (A) contains a structural unit (a3), the proportion of the structural unit (a3) is preferably 1 to 20 mol % per total structural units constituting the component (A), and more preferably 5 to 10 mol %. The above range provides a high effect of the structural unit (a3) and a satisfactory balance between the structural unit (a3) and other structural units.

The component (A) may contain another structural unit other than the above structural units (a1) to (a3), without detracting from the effects of the present invention. There are no particular restrictions on such a structural unit as long as it is another structural unit not classified into the above structural units (a1) to (a3). The multitude of conventionally known units for use in resist resins for use with a KrF positive excimer laser, an ArF excimer laser, or the like can be used.

The component (A) may use a copolymer having all the structural units (a1) and (a2), and an optional other structural unit (such as a structural unit (a3)), or may be a mixture of polymers having at least one of these structural units. In particular, a component (A) using a copolymer having the structural units (a1) and (a2) is preferred, since it provides the excellent effects of the present invention.

Of these, if the component (A) comprises the acid-dissociable dissolution inhibiting group (II) and another acid-dissociable dissolution inhibiting group as the acid-dissociable dissolution inhibiting group, the component (A) is preferably a mixture of a copolymer having a structural unit (a1) and a structural unit (a2) containing an acid-dissociable dissolution inhibiting group (II), and a copolymer having a structural unit (a1) and a structural unit (a2) containing an acid-dissociable dissolution inhibiting group other than the acid-dissociable dissolution inhibiting group (II) and not containing an acid-dissociable dissolution inhibiting group (II), since preparation of the component (A) is facilitated.

The component (A) can be obtained by polymerizing monomers which yield each of the structural units in a normal method, such as a known radical polymerization using a radical polymerization initiator such as azobisisobutyronitrile (AIBN).

The weight average molecular weight (the polystyrene equivalent weight average molecular weight determined using gel permeation chromatography (GPC), this also applies below) of the component (A) is preferably within a range from 5000 to 30000, and more preferably from 15000 to 25000. A component (A) having a weight average molecular weight of 30000 or less is preferred in terms of high level of resolution, in particular for use in thin-film implantation.

Moreover, a component (A) having a weight average molecular weight of 5000 or more is preferred in terms of high thermal resistance, in particular for use in thin-film implantation. That is, in the implantation process, since the resist pattern on the substrate is heated by the effect of heat generation caused by injection of an impurity, problems may occur in which the shape of the resist pattern is changed, and a certain component in the resist pattern is gasified to reduce the degree of vacuum in the reaction chamber. However, since the thermal resistance is high, the component (A) can be suitably used for this process.

Moreover, lower dispersity (Mw/Mn (number average molecular weight)) of the high molecular weight compound (A1) (closer to monodispersity) is preferred, since the resolution gets better. The dispersity is preferably within a range from 1.0 to 5.0, more preferably from 1.0 to 3.0, and most preferably from 1.0 to 2.5.

<Component (B)>

The component (B) can use, without any particular restrictions, any of the proposed acid generators for conventional chemically amplified resist compositions. There are a multitude of known acid generators, including: onium salt based acid generators such as iodonium salts and sulfonium salts; oxime sulfonate based acid generators; diazomethane based acid generators such as bisalkyl or bisaryl sulfonyl diazomethanes, and poly(bis-sulfonyl)diazomethanes; nitrobenzyl sulfonate based acid generators; iminosulfonate based acid generators; and disulfone based acid generators.

Examples of the onium salt based acid generator include compounds represented by the following general formulas (b-1) and (b-2).

[In the formula, $R^{1''}$ to $R^{3''}$, $R^{5''}$, and $R^{6''}$ each represents, independently, an aryl group or an alkyl group; and $R^{4''}$ represents a straight-chain, branched, or cyclic alkyl group or fluorinated alkyl group, wherein at least one of $R^{1''}$ to $R^{3''}$ represents an aryl group, and at least one of $R^{5''}$ and $R^{6''}$ represents an aryl group.]

In the formula (b-1), $R^{1''}$ to $R^{3''}$ each represents, independently, an aryl group or an alkyl group. Of the groups $R^{1''}$ to $R^{3''}$, at least one group represents an aryl group. It is preferable that at least two of $R^{1''}$ to $R^{3''}$ represent aryl groups, and it is most preferable that all of $R^{1''}$ to $R^{3''}$ are aryl groups.

There are no particular restrictions on the aryl groups of $R^{1''}$ to $R^{3''}$, and examples thereof include aryl groups having 6 to 20 carbon atoms, in which a part of or all of the hydrogen atoms may, or may not, be substituted by alkyl groups, alkoxy groups, or halogen atoms, or the like. In terms of enabling low cost synthesis, aryl groups having 6 to 10 carbon atoms are preferred. Specific example thereof include a phenyl group and a naphthyl group.

The alkyl group with which the hydrogen atom may be substituted in the aryl group is preferably an alkyl group having 1 to 5 carbon atoms, and most preferably, a methyl group, an ethyl group, a propyl group, an n-butyl group, and a tert-butyl group.

The alkoxy group with which the hydrogen atoms may be substituted in the aryl group is preferably an alkoxy group having 1 to 5 carbon atoms, and most preferably, a methoxy group and an ethoxy group.

The halogen atom with which the hydrogen atom may be substituted in the aryl group is preferably a fluorine atom.

There are no particular restrictions on the alkyl groups of $R^{1''}$ to $R^{3''}$, and examples thereof include a straight-chain, branched, or cyclic alkyl group having 1 to 10 carbon atoms. From the viewpoint of achieving excellent resolution, alkyl groups having 1 to 5 carbon atoms are preferred. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, although in terms of achieving excellent resolution and enabling low cost synthesis, a methyl group is preferred.

Of the above possibilities, it is most preferable that $R^{1''}$ to $R^{3''}$ are all phenyl groups.

$R^{4''}$ represents a straight-chain, branched, or cyclic alkyl group or fluorinated alkyl group.

The straight-chain alkyl group is preferably a group having 1 to 10 carbon atoms, more preferably a group having 1 to 8 carbon atoms, and most preferably a group having 1 to 4 carbon atoms. The cyclic alkyl group is preferably a cyclic group as shown for the above $R^{1''}$ having 4 to 15 carbon atoms, more preferably a group having 4 to 10 carbon atoms, and most preferably a group having 6 to 10 carbon atoms.

The fluorinated alkyl group is preferably a group having 1 to 10 carbon atoms, more preferably a group having 1 to 8 carbon atoms, and most preferably a group having 1 to 4 carbon atoms. Moreover, the fluorination ratio of the fluorinated alkyl group (fluorine atom proportion within the alkyl group) is preferably within a range from 10 to 100%, and more preferably from 50 to 100%, and groups in which all of the hydrogen atoms have been substituted by fluorine atoms are particularly preferable since the acid becomes stronger.

It is most preferable that $R^{4''}$ represent a straight-chain or cyclic alkyl group or fluorinated alkyl group.

In the formula (b-2), $R^{5''}$ and $R^{6''}$ each represents, independently, an aryl group or an alkyl group. Of the groups $R^{5''}$ and $R^{6''}$, at least one group represents an aryl group. It is preferable that both of $R^{5''}$ and $R^{6''}$ represent aryl groups.

Aryl groups of $R^{5''}$ and $R^{6''}$ are the same as those described for the aryl groups of $R^{1''}$ to $R^{3''}$.

Alkyl groups of $R^{5''}$ and $R^{6''}$ are the same as those described for the alkyl groups of $R^{1''}$ to $R^{3''}$.

Of the above possibilities, It is most preferable that both of $R^{5''}$ and $R^{6''}$ represent phenyl groups.

$R^{4''}$ in the formula (b-2) is the same as that described for the $R^{4''}$ in the formula (b-1).

Specific examples of onium salt based acid generators include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)disulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, tri(4-tert-butyl)phenylsulfonium trifluoromethanesulfonate, heptafluoropropanesulfonate or nonafluorobutanesulfonate, diphenyl(1-(4-methoxy)naphthylsulfonium trifluoromethanesulfonate, and heptafluoropropanesulfonate or nonafluorobutanesulfonate. Moreover, onium salts in which the anionic portion is substituted by methanesulfonate, n-propanesulfonate, n-butanesulfonate, or n-octanesulfonate, may be also used.

Furthermore, onium salts in which the anionic portion of the above general formula (b-1) or (b-2) is substituted by an anionic portion represented by the following general formula (b-3) or (b-4), may be also used (cationic portion is the same as that in (b-1) or (b-2)).

(b-3)

(b-4)

[In the formula, X" represents an alkylene group having 2 to 6 carbon atoms in which at least one hydrogen atom has been substituted by a fluorine atom; and Y" and Z" each represents, independently, an alkyl group having 1 to 10 carbon atoms in which at least one hydrogen atom has been substituted by a fluorine atom.]

X" represents a straight-chain or branched alkylene group in which at least one hydrogen atom has been substituted by a fluorine atom, and the number of carbon atoms in the alkylene group is within a range from 2 to 6, preferably from 3 to 5, and most preferably 3.

Y" and Z" each represents, independently, a straight-chain or branched alkyl group in which at least one hydrogen atom has been substituted by a fluorine atom, and the number of carbon atoms in the alkyl group is within a range from 1 to 10, preferably from 1 to 7, and most preferably from 1 to 3.

Lower numbers of carbon atoms within the alkylene group X" or the alkyl groups Y" and Z" in the above ranges of carbon atoms, result in better solubility within the resist solvent, and are consequently preferred.

Moreover, greater numbers of hydrogen atoms substituted by fluorine atoms in the alkylene group X" or the alkyl groups Y" and Z", result in a stronger acid, and improvement of the transparency relative to high energy light beams of 200 nm or less or electron beams, and are consequently preferred. The fluorine atom proportion within the alkylene group or alkyl groups, namely the fluorination ratio, is preferably within a range from 70 to 100%, and even more preferably from 90 to 100%, and perfluoroalkylene or perfluoroalkyl groups in which all of the hydrogen atoms have been substituted by fluorine atoms are the most preferred.

In the present invention, the term "oxime sulfonate based acid generator" refers to a compound containing at least one group represented by the following general formula (B-1), with a property of generating an acid by irradiation with radiation. Since such an oxime sulfonate based acid generator is often used for a chemically amplified resist composition, any oxime sulfonate based acid generator may be selected and used.

(In the formula (B-1), $R^{21}$ and $R^{22}$ each represents, independently, an organic group.)

In the present invention, the term "organic group" refers to a group which contains a carbon atom, and may contain another atom other than a carbon atom (such as a hydrogen atom, an oxygen atom, a nitrogen atom, a sulfur atom, and a halogen atom (fluorine atom, chlorine atom, and the like)).

The organic group of $R^{21}$ is preferably a straight-chain, branched, or cyclic alkyl group or aryl group. These alkyl group and aryl group may contain a substituent group. There are no particular restrictions on the substituent group, and examples thereof include a fluorine atom, or a straight-chain, branched, or cyclic alkyl group having 1 to 6 carbon atoms. Here, the term "contain a substituent group" means that a part of or all of the hydrogen atoms in the alkyl group or the aryl group are substituted by substituent groups.

The alkyl group is preferably a group having 1 to 20 carbon atoms, more preferably a group having 1 to 10 carbon atoms, even more preferably a group having 1 to 8 carbon atoms, particularly preferably a group having 1 to 6 carbon atoms, and most preferably a group having 1 to 4 carbon atoms. In particular, partially or completely halogenated alkyl groups (hereafter also referred to as the halogenated alkyl group) are preferred. The term "partially halogenated alkyl group" means an alkyl group in which a part of the hydrogen atoms are substituted by halogen atoms, and the term "completely halogenated alkyl group" means an alkyl group in which all of the hydrogen atoms are substituted by halogen atoms. Examples of the halogen atom include a fluorine atom, a chlorine atom, a bromine atom, and an iodine atom, and a fluorine atom is particularly preferred. That is, the halogenated alkyl group is preferably a fluorinated alkyl group.

The aryl group is preferably a group having 4 to 20 carbon atoms, more preferably a group having 4 to 10 carbon atoms, and most preferably a group having 6 to 10 carbon atoms. In particular, partially or completely halogenated aryl groups are preferred. The term "partially halogenated aryl group" means an aryl group in which a part of the hydrogen atoms are substituted by halogen atoms, and the term "completely halogenated aryl group" means an aryl group in which all of the hydrogen atoms are substituted by halogen atoms.

In particular, $R^{21}$ preferably represents an alkyl group having 1 to 4 carbon atoms or a fluorinated alkyl group having 1 to 4 carbon atoms, which does not contain a substituent group.

The organic group of $R^{22}$ is preferably a straight-chain, branched, or cyclic alkyl group or aryl group, or a cyano group. Alkyl groups and aryl groups of $R^{22}$ are the same as those described for the alkyl groups and aryl groups of $R^{21}$.

In particular, $R^{22}$ is preferably a cyano group, or an alkyl group having 1 to 8 carbon atoms or a fluorinated alkyl group having 1 to 8 carbon atoms, which does not contain a substituent group.

More preferable examples of the oxime sulfonate based acid generator include compounds represented by the following general formulas (B-2) and (B-3).

[In the formula (B-2), $R^{31}$ represents a cyano group, or an alkyl group or a halogenated alkyl group, which does not contain a substituent group. $R^{32}$ represents an aryl group. $R^{33}$ represents an alkyl group or a halogenated alkyl group, which does not contain a substituent group.]

[In the formula (B-3), $R^{34}$ represents a cyano group, or an alkyl group or a halogenated alkyl group, which does not contain a substituent group. $R^{35}$ represents a divalent or trivalent aromatic hydrocarbon group. $R^{36}$ represents an alkyl group or a halogenated alkyl group, which does not contain a substituent group. p represents an integer of 2 or 3.]

In the general formula (B-2), the alkyl group or the halogenated alkyl group of $R^{31}$, which does not contain a substituent group, is preferably a group having 1 to 10 carbon atoms, more preferably a group having 1 to 8 carbon atoms, and most preferably a group having 1 to 6 carbon atoms.

$R^{31}$ is preferably a halogenated alkyl group, and more preferably a fluorinated alkyl group.

Regarding the fluorinated alkyl group of $R^{31}$, preferably 50% or more of the hydrogen atoms in the alkyl group are fluorinated, more preferably 70% or more are fluorinated, and even more preferably 90% or more are fluorinated.

Examples of the aryl group of $R^{32}$ include aromatic hydrocarbon rings in which one hydrogen atom is removed, such as a phenyl group, a biphenylyl group, a fluorenyl group, a naphthyl group, an anthracyl group, and a phenanthryl group, and heteroaryl groups in which a part of the carbon atoms constituting a ring of these groups are substituted by hetero atoms such as an oxygen atom, a sulfur atom, and a nitrogen atom. Of these, a fluorenyl group is preferred.

The aryl group of $R^{32}$ may have a substituent group such as an alkyl group, a halogenated alkyl group, or an alkoxy group, each having 1 to 10 carbon atoms. The number of carbon atoms within the alkyl group or the halogenated alkyl group of the substituent group is preferably 1 to 8, and more preferably 1 to 4. Moreover, the halogenated alkyl group is preferably a fluorinated alkyl group.

The alkyl group or the halogenated alkyl group of $R^{33}$, which does not contain a substituent group, is preferably a group having 1 to 10 carbon atoms, more preferably a group having 1 to 8 carbon atoms, and most preferably a group having 1 to 6 carbon atoms.

$R^{33}$ is preferably a halogenated alkyl group, more preferably a fluorinated alkyl group, and most preferably a partially fluorinated alkyl group.

Regarding the fluorinated alkyl group of $R^{33}$, preferably 50% or more of the hydrogen atoms in the alkyl group are fluorinated, more preferably 70% or more are fluorinated, and even more preferably 90% or more are fluorinated, since the generated acid becomes stronger. The most preferable is a completely fluorinated alkyl group in which 100% of the hydrogen atoms are substituted by fluorine.

In the general formula (B-3), the alkyl group or the halogenated alkyl group of $R^{34}$, which does not contain a substituent group, is the same as that described for the alkyl group or the halogenated alkyl group of $R^{31}$, which does not contain a substituent group.

Examples of the divalent or trivalent aromatic hydrocarbon group of $R^{35}$ include aryl groups of $R^{32}$ in which one or two hydrogen atoms are removed.

The alkyl group or the halogenated alkyl group of $R^{36}$, which does not contain a substituent group, is the same as that described for the alkyl group or the halogenated alkyl group of $R^{31}$, which does not contain a substituent group.

p is preferably 2.

Specific examples of oxime sulfonate based acid generators include

α-(p-toluenesulfonyloxyimino)-benzyl cyanide,

α-(p-chlorobenzenesulfonyloxyimino)-benzyl cyanide,

α-(4-nitrobenzenesulfonyloxyimino)-benzyl cyanide,

α-(4-nitro-2-trifluoromethylbenzenesulfonyloxyimino)-benzyl cyanide,

α-(benzenesulfonyloxyimino)-4-chlorobenzyl cyanide,

α-(benzenesulfonyloxyimino)-2,4-dichlorobenzyl cyanide,

α-(benzenesulfonyloxyimino)-2,6-dichlorobenzyl cyanide,

α-(benzenesulfonyloxyimino)-4-methoxybenzyl cyanide,

α-(2-chlorobenzenesulfonyloxyimino)-4-methoxybenzyl cyanide,

α-(benzenesulfonyloxyimino)-thiene-2-ylacetonitrile,

α-(4-dodecylbenzenesulfonyloxyimino)-benzyl cyanide,

α-[(p-toluenesulfonyloxyimino)-4-methoxyphenyl]acetonitrile,

α-[(dodecylbenzenesulfonyloxyimino)-4-methoxyphenyl] acetonitrile,

α-(tosyloxyimino)-4-thienyl cyanide,

α-(methylsulfonyloxyimino)-1-cyclopentenylacetonitrile,

α-(methylsulfonyloxyimino)-1-cyclohexenylacetonitrile,

α-(methylsulfonyloxyimino)-1-cycloheptenylacetonitrile,

α-(methylsulfonyloxyimino)-1-cyclooctenylacetonitrile,

α-(trifluoromethylsulfonyloxyimino)-1-cyclopentenylacetonitrile,

α-(trifluoromethylsulfonyloxy imino)-cyclohexylacetonitrile,

α-(ethylsulfonyloxyimino)-ethylacetonitrile,

α-(propylsulfonyloxyimino)-propylacetonitrile,

α-(cyclohexylsulfonyloxyimino)-cyclopentylacetonitrile,

α-(cyclohexylsulfonyloxyimino)-cyclohexylacetonitrile,

α-(cyclohexylsulfonyloxyimino)-1-cyclopentenylacetonitrile,

α-(ethylsulfonyloxyimino)-1-cyclopentenylacetonitrile,

α-(isopropylsulfonyloxyimino)-1-cyclopentenylacetonitrile,

α-(n-butylsulfonyloxyimino)-1-cyclopentenylacetonitrile,

α-(ethylsulfonyloxyimino)-1-cyclohexenylacetonitrile,

α-(isopropylsulfonyloxyimino)-1-cyclohexenylacetonitrile,

α-(n-butylsulfonyloxyimino)-1-cyclohexenylacetonitrile,

α-(methylsulfonyloxyimino)-phenylacetonitrile,

α-(methylsulfonyloxyimino)-p-methoxyphenylacetonitrile,

α-(trifluoromethylsulfonyloxyimino)-phenylacetonitrile,

α-(trifluoromethylsulfonyloxyimino)-p-methoxyphenylacetonitrile,

α-(ethylsulfonyloxyimino)-p-methoxyphenylacetonitrile,

α-(propylsulfonyloxyimino)-p-methylphenylacetonitrile, and

α-(methylsulfonyloxyimino)-p-bromophenylacetonitile.

Moreover, compounds represented by the following formulas are included.

Moreover, of the compounds represented by the above general formulas (B-2) and (B-3), examples of preferred compounds are shown below.

-continued

-continued

Of the above exemplary compounds, the following three compounds are preferred.

Among the diazomethane based acid generators, specific examples of bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Furthermore, specific examples of poly(bis-sulfonyl)diazomethanes include
1,3-bis(phenylsulfonyldiazomethylsulfonyl)propane (A=3),
1,4-bis(phenylsulfonyldiazomethylsulfonyl)butane (A=4),
1,6-bis(phenylsulfonyldiazomethylsulfonyl)hexane (A=6),
1,10-bis(phenylsulfonyldiazomethylsulfonyl)decane (A=10),
1,2-bis(cyclohexylsulfonyldiazomethylsulfonyl)ethane (B=2),
1,3-bis(cyclohexylsulfonyldiazomethylsulfonyl)propane (B=3),
1,6-bis(cyclohexylsulfonyldiazomethylsulfonyl)hexane (B=6), and
1,10-bis(cyclohexylsulfonyldiazomethylsulfonyl)decane (B=10), the structures of which are shown below.

Of these, diazomethane based acid generators are preferred which provides the excellent effects of the present invention.

As the component (B), these acid generators may be used singularly, or in combinations of two or more different types.

The blend quantity of the component (B) in a positive resist composition according to the present invention is within a range from 0.5 to 30 parts by weight, and preferably from 1 to 10 parts by weight, per 100 parts by weight of the component (A). If the quantity is within the above range, pattern formation can progress satisfactorily. Moreover, it is preferable to have the quantity within the range, since a uniform solution can be obtained, and the storage stability becomes satisfactory.

<Component (C)>

The component (C) is a compound having a radiation absorbing ability. There are no particular restrictions on the component (C) as long as it has an absorbing ability in the wavelength bandwidth of the radiation used for exposure. In particular, the component (C) is preferably capable of reducing stationary waves generated by reflection from the substrate, and diffused reflection caused by difference in level on the surface of the substrate.

Specific example of a compound having an absorbing ability in 248 nm serving as a wavelength of a KrF excimer laser include low molecular weight compounds such as dyes and high molecular weight compounds such as resins. More specific examples thereof include the following compounds.

Compound (c1): compound having an anthracene ring as a substructure
Compound (c2): compound having a benzene ring as a substructure
Compound (c3): compound having a naphthalene ring as a substructure
Compound (c4): compound having a bisphenyl as a substructure The compound (c1) may be any compound having an anthracene ring as a substructure. Examples of such a compound include dyes such as anthracene methanol, anthracene ethanol, anthracenecarboxylic acid, anthracene, methylanthracene, dimethylanthracene, and hydroxyanthracene. Of these, anthracene methanol is particularly preferred.

The compound (c2) may be any compound having a benzene ring as a substructure. Examples of such a compound include low molecular weight compounds such as dyes including benzene, alkylbenzenes such as methylbenzene and ethylbenzene, benzyl alcohol, cyclohexylbenzene, benzoic acid, salicylic acid, and anisole, and resins such as novolak resins.

The novolak resin can be obtained by addition condensation between an aromatic substance having a phenolic hydroxyl group (hereafter simply referred to as "phenols") and an aldehyde with an acid catalyst. Examples of phenols used herein include, phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, p-phenylphenol, resorcinol, hydroquinone, hydroquinonemonomethylether, pyrogallol, phloroglucinol, hydroxydiphenyl, bisphenol A, gallic acids, gallic acid esters, α-naphthol, and β-naphthol.

Moreover, examples of the aldehyde include formaldehyde, furfural, benzaldehyde, nitrobenzaldehyde, and acetaldehyde.

There are no particular restrictions on the catalyst for the addition condensation reaction, and examples of a used acid catalyst include a hydrochloric acid, a nitric acid, a sulfuric acid, a formic acid, an oxalic acid, and an acetic acid.

If a novolak resin is used, the weight average molecular weight is preferably within a range from 1000 to 30000.

The compound (c3) may be any compound having a naphthalene ring as a substructure. Examples of such a compound include dyes such as naphthalene, methylnaphthalene, dimethylnaphthalene, ethylnaphthalene, 1-naphthol, 2-naphthol, naphthalenediol, and naphthalenetriol.

The compound (c4) may be any compound having a bisphenyl as a substructure. Examples of such a compound include dyes such as biphenyl, dimethylbiphenyl, biphenylol, biphenyldiol, and biphenyltetraol.

Moreover, examples thereof may also include benzophenone based compounds and naphthoquinone based compounds.

Examples of the benzophenone based compound include 2,4-dihydroxybenzophenone, 2,3,4-trihydroxybenzophenone, 2,2',4,4'-tetrahydroxybenzophenone, 2,3,4,4'-tetrahydroxybenzophenone, 2,2', 5,6'-tetrahydroxybenzophenone, 2,2'-dihydroxy-4-methoxybenzophenone, 2,6-dihydroxy-4-methoxybenzophenone, 2,2'-dihydroxy-4,4'-dimethoxybenzophenone, 4-dimethylamino-2',4'-dihydroxybenzophenone, 4-dimethylamino-3', and 4'-dihydroxybenzophenone.

Examples of the naphthoquinone based compound include ester compounds of a phenol compound and 1,2-naphthoquinonediazido-5-sulfonyl chloride or 1,2-naphthoquinonediazido-4-sulfonyl chloride. Examples of the phenol compound include tris(4-hydroxyphenyl)methane, bis(4-hydroxy-3-methylphenyl)-2-hydroxyphenylmethane, bis(4-hydroxy-2,3,5-trimethylphenyl)-2-hydroxyphenylmethane, bis(4-hydroxy-3,5-dimethylphenyl)-2-hydroxyphenylmethane, bis(4-hydroxy-3,5-dimethylphenyl)-3-hydroxyphenylmethane, bis(4-hydroxy-3,5-dimethylphenyl)-4-hydroxyphenylmethane, bis(4-hydroxy-2,5-dimethylphenyl)-2-hydroxyphenylmethane, bis(4-hydroxy-2,5-dimethylphenyl)-3-hydroxyphenylmethane, bis(4-hydroxy-2,5-dimethylphenyl)-4-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis(5-cyclohexyl-4-hydroxy-2-methylphenyl)-4-hydroxyphenylmethane, bis(5-cyclohexyl-4-hydroxy-2-methylphenyl)-2-hydroxyphenylmethane, bis(5-cyclohexyl-4-hydroxy-2-methylphenyl)-3-hydroxyphenylmethane, bis(5-cyclohexyl-4-hydroxy-2-methylphenyl)-4-hydroxyphenylmethane, bis(5-cyclohexyl-4-hydroxy-2-methylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, 2-(4-hydroxyphenyl)-2-(4'-hydroxyphenyl)propane, 2-(2,4-dihydroxyphenyl)-2-(2',4'-dihydroxyphenyl)propane, 2-(2,3,4-trihydroxyphenyl)-2-(2',3',4'-trihydroxyphenyl)propane, 2-(3-fluoro-4-hydroxyphenyl)-2-(3'-fluoro-4'-hydroxyphenyl)propane, 2-(2,4-dihydroxyphenyl)-2-(4'-hydroxyphenyl)propane, 2-(2,3,4-trihydroxyphenyl)-2-(4'-hydroxyphenyl)propane, 2-(2,3,4-trihydroxyphenyl)-2-(4'-hydroxy-3',5'-dimethylphenyl)propane, bis(2,4-dihydroxyphenyl)methane, bis(2,3,4-trihydroxyphenyl)methane, 2,3,4-trihydroxyphenyl-4'-hydroxyphenylmethane, 1,1-di(4-hydroxyphenyl))cyclohexane, and 2,4-bis[1-(4-hydroxyphenyl)isopropyl]-5-hydroxyphenol.

The component (C) may be used singularly, or in combinations of two or more types.

<Other Optional Components>

In a positive resist composition according to the present invention, in order to improve the resist pattern shape and the long term stability, a nitrogen-containing organic compound (D) (hereafter referred to as the component (D)) can also be added as an optional component.

A multitude of different compounds have already been proposed for this component (D), and any of these known compounds can be used. Of these, aliphatic amines, in particular, secondary and tertiary aliphatic amines are preferred.

The aliphatic amines include amines in which at least one of the hydrogen atoms in the ammonia $NH_3$ has been substituted by an alkyl group or hydroxyalkyl group having 12 or less carbon atoms (alkylamines or alkylalcoholamines). Specific examples thereof include: monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkylalcoholamines such as diethanolamine, triethanolamine, diisopropanolamine, triisopropanolamine, di-n-octanolamine, and tri-n-octanolamine. Of these, alkylalcoholamines and trialkylamines are preferred, and alkylalcoholamines are the most preferred. Of the alkylalcoholamines, triethanolamine and triisopropanolamine are the most preferred.

These compounds may be used singularly, or in combinations of two or more different compounds.

This component (D) is typically added in a quantity within a range from 0.01 to 5.0 parts by weight per 100 parts by weight of the component (A).

In a positive resist composition according to the present invention, in order to prevent any deterioration in sensitivity caused by the addition of the aforementioned component (D), and to improve the resist pattern shape and the long term stability, an organic carboxylic acid, a phosphorus oxo acid, or a derivative thereof (E) (hereafter referred to as component (E)) can also be added as an optional component. Either one, or both of the component (D) and the component (E) can be used.

Examples of organic carboxylic acids include malonic acid, citric acid, malic acid, succinic acid, benzoic acid, and salicylic acid.

Examples of phosphorus oxo acids or derivatives thereof include phosphoric acid or derivatives thereof such as esters, including phosphoric acid, di-n-butyl phosphate, and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is preferred.

This component (E) is typically added in a quantity within a range from 0.01 to 5.0 parts by weight per 100 parts by weight of the component (A).

A positive resist composition according to the present invention can be produced by dissolving materials in an organic solvent.

The organic solvent may be any solvent capable of dissolving the various components to generate a uniform solution, and one or more solvents selected from known materials used as the solvents for conventional chemically amplified resists can be used.

Specific examples thereof include: lactones such as γ-butyrolactone; ketones such as acetone, methyl ethyl ketone, cyclohexanone, methyl isoamyl ketone, and 2-heptanone; polyhydric alcohols and derivatives thereof such as monomethyl ether, monoethyl ether, monopropyl ether, monobutyl ether, or monophenyl ether of ethylene glycol, ethylene glycol monoacetate, diethylene glycol, diethylene glycol monoacetate, propylene glycol, propylene glycol monoacetate, dipropylene glycol, or dipropylene glycol monoacetate; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

These organic solvents can be used singularly, or as a mixed solvent containing two or more different solvents.

Furthermore, mixed solvents of propylene glycol monomethyl ether acetate (PGMEA) and a polar solvent are preferred. The mixing ratio (weight ratio) can be determined with due consideration given to the co-solubility of PGMEA and the polar solvent, although the ratio is preferably within a range from 1:9 to 9:1, and even more preferably from 2:8 to 8:2.

More specifically, in those cases where EL is mixed as the polar solvent, the weight ratio of PGMEA:EL is preferably within a range from 1:9 to 9:1, and even more preferably from 2:8 to 8:2.

Furthermore, other preferred organic solvents include mixed solvents of at least one of PGMEA and EL, with γ-butyrolactone. In such cases, the mixing ratio between the former and the latter components is preferably a weight ratio within a range from 70:30 to 95:5.

There are no particular restrictions on the quantity of organic solvent used, and the quantity can be set in accordance with the desired resist film thickness, so as to generate a composition with a concentration that is suitable for application to the substrate. Solvent quantities that generate a solid fraction concentration for the resist composition within a range from 2 to 20% by weight, and preferably from 5 to 15% by weight, are ideal.

Other miscible additives can also be added to a positive resist composition of the present invention according to need, and examples include additive resins for improving the properties of the resist film, surfactants for improving the ease of application, dissolution inhibitors, plasticizers, stabilizers, colorants, halation prevention agents, and dyes.

As described above, the positive resist composition according to the present invention is capable of forming a resist pattern with small dimensional change of the resist pattern on a thin film of a thickness that can be used for a thin-film implantation process, in particular a thin film of 500 nm or less, and is suitable for use in thin-film implantation processes. One reason why such an effect can be obtained is considered to be an influence of the acid-dissociable dissolution inhibiting group (II) that has a low activation energy in a deprotection reaction and is readily dissociated. That is, conventionally, when a component (C) is blended so as to prevent SW, the radiation transmissivity of the resist film decreases and the pattern can not be satisfactorily formed. Hence SW cannot be sufficiently reduced. This is presumed to be because the acid generation efficiency from the component (B) is worsened due to the decrease in the transmissivity and thus the acid-dissociable dissolution inhibiting group is not satisfactorily dissociated. On the other hand, in the present invention, since the acid-dissociable dissolution inhibiting group is readily dissociated, patterns can be satisfactorily formed even if the component (C) is blended. Therefore, resist patterns with small dimensional change in which SW has been sufficiently reduced can be formed.

In this manner, the positive resist composition according to the present invention is capable of forming a resist pattern with small dimensional change of the resist pattern on a thin film of 500 nm or less, and thus is suitable for use in a thin-film implantation process.

Furthermore, the sensitivity and the resolution are excellent with the positive resist composition according to the present invention. Moreover, the depth of focus is large. Furthermore, the mask linearity is also excellent, and a resist pattern having a high fidelity with the mask size can be reproduced with variations in the mask size.

Since a resist pattern for use in the thin-film implantation process is used as a mask for injecting impurity ions, then as described above, the positive resist composition according to the present invention capable of forming a pattern with excellent reproducibility, not only with small dimensional change but also with very fine dimensions, is suitable for use in thin-film implantation processes.

<<Method of Forming a Resist Pattern>>

A method for forming a resist pattern according to the present invention can be performed in the manner described below.

A positive resist composition according to the present invention is first applied to the surface of a substrate such as a silicon wafer using a spinner or the like, and prebaking is then performed under temperature conditions of 80 to 150° C. for 40 to 120 seconds, and preferably for 60 to 90 seconds, thereby forming a resist film having a thickness of 500 nm or less. Next, the resist film is subjected to selective exposure through a desired mask pattern using an exposure apparatus, and then a heat treatment (post exposure baking (PEB)) is performed under temperature conditions of 80 to 150° C. for 40 to 120 seconds, and preferably for 60 to 90 seconds. Subsequently, developing is performed using an alkali developing solution such as an aqueous solution of tetramethylammonium hydroxide (TMAH) with a concentration of for example 1 to 10% by weight. Then, rinsing is performed to wash away the developing solution on the substrate and the resist composition that has been dissolved in the developing solution. The substrate is then dried to obtain the resist pattern for a thin-film implantation process.

The steps up to here can be performed using publicly known methods. Preferably, the condition of operation is set in due accordance with the makeup or the properties of the positive resist composition to be used.

The resist film can be suitably used for a thin-film implantation process if the thickness is 500 nm or less, preferably 100 to 450 nm, and more preferably 200 to 400 nm.

There are no particular restrictions on the radiation used for the exposure, and an ArF excimer laser, a KrF excimer laser, an $F_2$ excimer laser, EUV (extreme ultraviolet), VUV (vacuum ultraviolet), an electron beam, X-ray or soft X-ray radiation can be used. A positive resist composition according to the present invention is particularly effective for KrF excimer lasers, electron beams, and EUV (extreme ultraviolet), and in particular, for KrF excimer lasers.

According to circumstances, postbaking may be included after the above alkali developing.

An organic or inorganic anti-reflective film may also be provided between the substrate and the resist film, or on the resist film.

The resist pattern obtained in this manner is small in the dimensional change even on a thin film of 500 nm or less, and thus is suitable for use in a thin-film implantation process.

EXAMPLES

Hereunder is a description of examples of the present invention, but these examples are not to be considered as limiting the scope of the present invention.

Examples 1, 2, and 4 are examples of the present invention, and Example 3 is a comparative example.

In the following Examples 1 to 3, a copolymer (resin A) represented by the following formula (1) and a copolymer (resin B) represented by the following formula (2) were used.

[In the formula, $m^1:n^1=61:39$ (molar ratio); weight average molecular weight=8000]

[In the formula, $m^2:n^2=61:39$ (molar ratio); weight average molecular weight=8000]

Example 1

100 parts by weight of the above resin A as a component (A); 4.0 parts by weight of bis(cyclohexylsulfonyl)diazomethane represented by the following formula (3) and 2.0 parts by weight of bis(1,1-dimethylethylsulfonyl)diazomethane represented by the following formula (4) as a component (B); 6 parts by weight of benzophenone and 6 parts by weight of an ester compound between 1 mole of 1-[1-(4-hydroxyphenyl)isopropyl]-4-[1,1-bis(4-hydroxyphenyl)ethyl]benzene, bis(4-hydroxy-2,3,5-trimethylphenyl)-2-hydroxyphenylmethane, and 3 mole of 1,2-naphthoquinonediazido-5-sulfonyl chloride as a component (C); 0.14 parts by weight of triisopropanolamine as a component (D); 2 parts by weight of 4,4'-[(2-hydroxyphenyl)methylene]bis(2-cyclohexyl-5-methylphenol as a component (E); and 0.05 parts by weight of a fluorochemical surfactant (Product Name XR-104, manufactured by Dainippon Ink and Chemicals, Incorporated) were dissolved in 700 parts by weight of a mixed solvent of PGMEA and EL (PGMEA:EL=80:20 (weight ratio)) to obtain the positive resist composition solution.

-continued (4)

Example 2

The positive resist composition solution was obtained in the same manner as that of Example 1, except that a mixed resin of resin A:resin B=75:25 (weight ratio) was used as a component (A).

Example 3

The positive resist composition solution was obtained in the same manner as that of Example 1, except that a mixed resin of resin A: resin B=50:50 (weight ratio) was used as a component (A).

Example 4

The positive resist composition solution was obtained in the same manner as that of Example 1, except that a resin in which the weight average molecular weight of the component (A) was adjusted to 20000 was used.
(Evaluation)

The positive resist composition solutions obtained in the above manners were evaluated as follows.
[Sensitivity Evaluation]

The positive resist composition solutions obtained in the Example 4 or Example 3 were evenly applied to an 8-inch silicon wafer using a spinner, and were then prebaked and dried at 90° C. for 60 seconds on a hotplate, thereby forming resist films having a thickness of 380 nm. "TSP-10A" (Product Name, manufactured by Tokyo Ohka Kogyo Co., Ltd.) was evenly applied to the resist films using a spinner, and then heated at 60° C. for 60 seconds, thereby forming anti-reflective films having a thickness of 44 nm.

Next, the films were selectively exposed through a binary mask pattern, using a KrF exposure apparatus (wavelength of 248 nm) NSR-S203B (manufactured by Nikon Corporation, NA (numerical aperture)=0.68, σ=0.78).

Subsequently, a PEB treatment was performed under the conditions of 110° C. for 60 seconds, the resist films were subjected to puddle development for 60 seconds at 23° C. in a 2.38% by weight aqueous solution of tetramethylammonium hydroxide, and the films were then rinsed with pure water for 30 seconds and dried by shaking. The films were further heated and dried at 100° C. for 60 seconds, thereby forming 180 nm line and space (1:1) resist patterns (hereafter referred to as L/S patterns), 180 nm line width isolated line patterns, and 180 nm space width trench patterns (isolated space patterns). These patterns were observed with a scanning electron microscope (CD SEM S-9200) manufactured by Hitachi, Ltd., and the exposure dose Exp (sensitivity) (unit: mJ), at which a 180 nm L/S pattern could be reproduced accurately, was determined. The results are shown in Table 1.

[Resolution Evaluation]

The limiting resolution at the above Exp was determined. The results are shown in Table 1.
[Depth of Focus (DOF) Evaluation]

While the depth of focus was appropriately shifted upward or downward at the above Exp, resist patterns were formed in the same manner as described above. The breadth in the depth of focus (μm) at which each pattern could be obtained within a range of ±10% in the rate of dimensional change, was determined.

The results are shown in Table 1. As is apparent from these results, DOF was broad in Example 4.

Moreover, Exp was low, meaning high sensitivity. On the other hand, in Example 3, DOF was narrow, and in particular, DOF was narrow when isolated patterns such as isolated line patterns and trench patterns were formed.

TABLE 1

|  | Resolution | | DOF (μm) | |  |
|---|---|---|---|---|---|
|  | Exp (mJ) | (nm) | L/S | Isolated line | Trench |
| Example 3 | 24 | 170 | 0.5 | 0.4 | 0.1 |
| Example 4 | 15 | 150 | 0.7 | 0.6 | 0.4 |

[Mask Linearity Evaluation]

With variations in the size of mask (L/S pattern, 1:1) from 150 nm to 250 nm at the above Exp, L/S patterns were formed in the same manner as described above. The line width (pattern dimension (hereunder referred to as CD)) of the formed resist pattern was measured.

Figure 1:
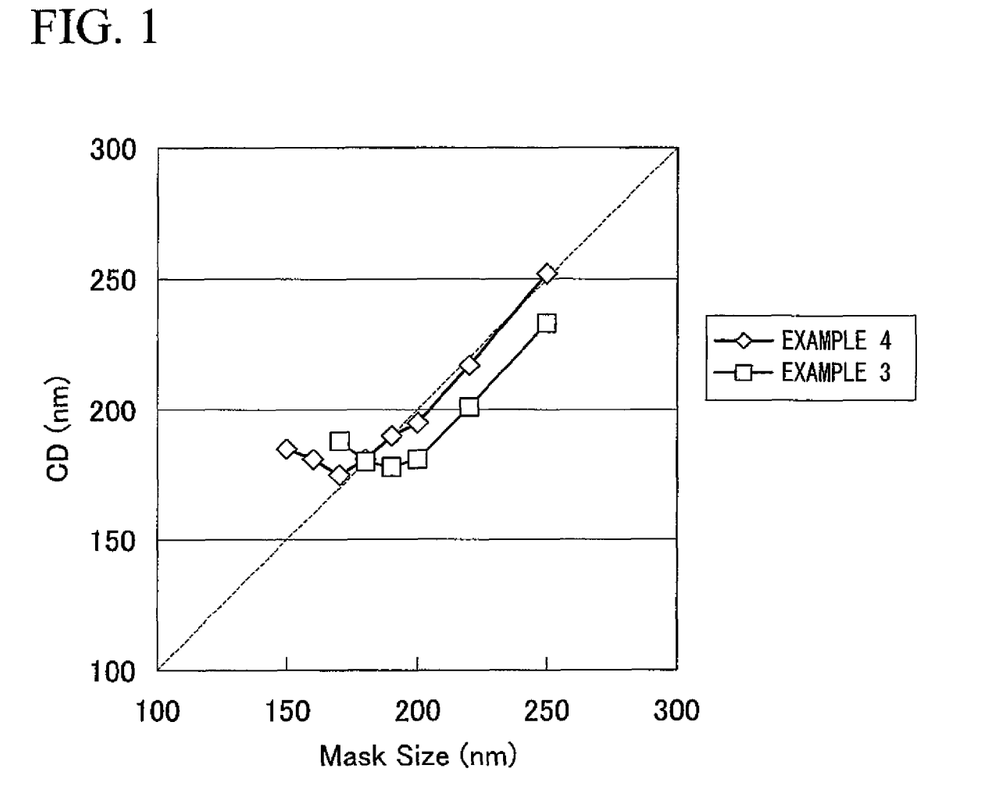
FIG. 1 is a graph showing the results of mask linearity evaluation in Examples 3 and 4.

FIG. 1 shows the results of Examples 4 and 3. As is apparent from these results, resist patterns formed in Example 4 had more fidelity with the mask than those of Example 3.

In the graph of FIG. 1, the horizontal axis shows the mask size (space width, m), the vertical axis shows CD (line width, nm) of the resist pattern, and the broken line is a line where resist pattern size=mask size, meaning that the mask linearity is more satisfactory as it gets closer to the broken line.
[SW Evaluation]

The positive resist composition solutions obtained in the Examples 1 to 4 were used to form resist films each having a thickness of 320 nm, 340 nm, 360 nm, 380 nm, 400 nm, and 420 nm, in the same manner as that of the above [DOF Evaluation]. L/S patterns (1:1) whose target was 180 nm were formed at the above Exp, and the line width pattern dimension (hereunder referred to as CD)) of the formed resist patterns was measured. The difference between the maximum CD and the minimum CD amongst the obtained CD at this time was obtained as SW.

The results are shown in Table 2. As is apparent from these results, in Examples 1, 2, and 4, the SW was as small as 20% or less of the target CD.

TABLE 2

|  | SW (μm) |
|---|---|
| Example 1 | 0.025 |
| Example 2 | 0.036 |
| Example 3 | 0.045 |
| Example 4 | 0.022 |

[Thermal Resistance Evaluation]

The resist patterns obtained in the above manners were baked at 120° C. for 5 minutes, and were then evaluated in terms of the shape.

In Example 1, the shape was slightly changed after baking, while in particular in Examples 2 and 4, the shape remained almost unchanged, showing high thermal resistance.

INDUSTRIAL APPLICABILITY

The present invention is capable of forming a resist pattern with small dimensional change of the resist pattern on a thin film, can be applied as a positive resist composition for a thin-film implantation process, and can be applied to a method for forming a resist pattern.

The invention claimed is:

1. A positive resist composition for a thin-film implantation process comprising:
   a resin component (A) with an acid-dissociable dissolution inhibiting group, whose alkali solubility increases by the action of an acid;
   an acid generator component (B) which generates an acid by irradiation with radiation; and
   a compound (C) having a radiation absorbing ability, wherein
   said resin component (A) comprises a structural unit (a1) derived from a hydroxystyrene and a structural unit (a2) obtained by substituting the hydrogen atom in a hydroxyl group of said structural unit (a1) with an acid-dissociable dissolution inhibiting group,
   said acid-dissociable dissolution inhibiting group contains an acid-dissociable dissolution inhibiting group (II) represented by the following general formula (II) as a main component:

(II)

[wherein, X represents an alicyclic group, an aromatic cyclic hydrocarbon group, or an alkyl group having 1 to 5 carbon atoms, $R^1$ represents an alkyl group having 1 to 5 carbon atoms, or alternatively, X and $R^1$ each represents, independently, an alkylene group having 1 to 5 carbon atoms, in which an end of X and an end of $R^1$ may be bonded with each other; and $R^2$ represents an alkyl group having 1 to 5 carbon atoms or a hydrogen atom],
   said acid generator component (B) comprises diazomethane based acid generators, and
   said compound (C) having the radiation absorbing ability comprises ester compounds of a phenol compound and 1,2-naphthoquinonediazido-5-sulfonyl chloride or 1,2-naphthoquinonediazido-4-sulfonyl chloride.

2. A positive resist composition for a thin-film implantation process according to claim 1, wherein said acid-dissociable dissolution inhibiting group (II) is a 1-alkoxyalkyl group.

3. A positive resist composition for a thin-film implantation process according to any one of claim 1 and claim 2, wherein said acid-dissociable dissolution inhibiting group includes at least one of acid-dissociable dissolution inhibiting group (III) selected from the group consisting of a chain-like tertiary alkoxycarbonyl group, a chain-like or cyclic tertiary alkyl group, and a chain-like tertiary alkoxycarbonylalkyl group.

4. A positive resist composition for a thin-film implantation process according to any one of claim 1 and claim 2, further comprising a nitrogen-containing organic compound (D).

5. A positive resist composition for a thin-film implantation process according to any one of claim 1 and claim 2, wherein a weight average molecular weight of said resin component (A) is within a range from 5000 to 30000.

6. A method for forming a resist pattern comprising:
   forming a resist thin film having a thickness of 500 nm or less using a positive resist composition for a thin-film implantation process according to any one of claim 1 and claim 2, on a substrate;
   selectively exposing the resist thin film; and
   developing the resist thin film to form a resist pattern.

7. A positive resist composition for a thin-film implantation process according to claim 1, wherein the weight ratio of the acid generator component (B): the compound (C) is 0.5-30: 12.

* * * * *

UNITED STATES PATENT AND TRADEMARK OFFICE
CERTIFICATE OF CORRECTION

PATENT NO.        : 7,910,281 B2
APPLICATION NO.   : 11/815205
DATED             : March 22, 2011
INVENTOR(S)       : Takako Suzuki et al.

It is certified that error appears in the above-identified patent and that said Letters Patent is hereby corrected as shown below:

Column 3, Line 59, Change "mm" to --nm--.

Column 5, Line 54, Change "opposition," to --o-position,--.

Column 5, Line 58, Change "opposition," to --o-position,--.

Column 8, Line 43 (Approx), Change "itself," to --itself;--.

Column 15, Line 60, Change "$R^{31}$," to --$R^{33}$,--.

Column 16, Line 34, Change "(trifluoromethylsulfonyloxy imino)" to --(trifluoromethylsulfonyloxyimino)--.

Column 16, Line 67, Change "bromophenylacetonitile." to --bromophenylacetonitrile.--.

Column 17, Line 46-49 (Structure),
Change

Column 22, Line 52 (Approx.), Change "bisphenyl" to --biphenyl--.

Column 22, Line 67, Change "novolak" to --novolac--.

Signed and Sealed this
Twenty-fifth Day of October, 2011

David J. Kappos
*Director of the United States Patent and Trademark Office*

CERTIFICATE OF CORRECTION (continued)
U.S. Pat. No. 7,910,281 B2

Column 23, Line 1, Change "novolak" to --novolac--.

Column 23, Line 22, Change "novolak" to --novolac--.

Column 23, Line 31 (Approx), Change "bisphenyl" to --biphenyl--.

Column 23, Line 33 (Approx), Change "biphenyltetraol." to --biphenyltetrol.--.

Column 30, Line 39, Change "m)," to --nm),--.

Column 30, Line 50, Change "pattern" to --(pattern--.